United States Patent
Shilimkar et al.

(10) Patent No.: US 11,177,207 B2
(45) Date of Patent: Nov. 16, 2021

(54) COMPACT TRANSISTOR UTILIZING SHIELD STRUCTURE ARRANGEMENT

(71) Applicant: NXP USA, Inc., Austin, TX (US)

(72) Inventors: Vikas Shilimkar, Chandler, AZ (US); Kevin Kim, Gilbert, AZ (US); Charles John Lessard, Gilbert, AZ (US); Humayun Kabir, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 63 days.

(21) Appl. No.: 16/720,579

(22) Filed: Dec. 19, 2019

(65) Prior Publication Data
US 2021/0193569 A1     Jun. 24, 2021

(51) Int. Cl.
*H01L 23/522*     (2006.01)
*H01L 23/528*     (2006.01)

(52) U.S. Cl.
CPC ...... *H01L 23/5225* (2013.01); *H01L 23/5286* (2013.01)

(58) Field of Classification Search
CPC ........... H01L 23/5225; H01L 21/32051; H01L 21/76802; H01L 21/823475; H01L 23/5226; H01L 23/528; H01L 23/66; H01L 23/4824; H01L 27/0203
See application file for complete search history.

(56) References Cited

U.S. PATENT DOCUMENTS

| | | | |
|---|---|---|---|
| 7,135,766 B1* | 11/2006 | Costa | H01L 23/3677 257/700 |
| 9,653,410 B1* | 5/2017 | Holmes | H01L 23/5225 |
| 10,103,233 B1 | 10/2018 | Khalil et al. | |
| 10,147,686 B1 | 12/2018 | Lessard et al. | |

OTHER PUBLICATIONS

U.S. Appl. No. 16/114,468; not yet published; 44 pages (filed Aug. 28, 2018).

* cited by examiner

*Primary Examiner* — Dung A. Le

(57) ABSTRACT

A transistor includes a semiconductor substrate having a first terminal and a second terminal. An interconnect structure is formed on an upper surface of the semiconductor substrate, the interconnect structure being formed of multiple layers of dielectric material and electrically conductive material. The electrically conductive material of the interconnect structure includes a pillar in electrical contact with the first terminal, a first runner electrically connected to the pillar, a tap interconnect in electrical contact with the second terminal, a second runner electrically connected to the tap interconnect, a shield structure positioned between the pillar and the tap interconnect, and a shield runner electrically connected to the shield structure, the shield runner overlying the second runner in a direction perpendicular to the upper surface of the semiconductor substrate.

20 Claims, 8 Drawing Sheets

COMPACT TRANSISTOR UTILIZING SHIELD STRUCTURE ARRANGEMENT

TECHNICAL FIELD OF THE INVENTION

The present invention relates generally to field effect transistors. More specifically, the present invention relates to a field effect transistor design in a compact form factor having a shield structure between the input and output of the active device.

BACKGROUND OF THE INVENTION

A typical high power semiconductor device package may include one or more input leads, one or more output leads, one or more transistors, wirebonds coupling the input lead(s) to the transistor(s), and wirebonds coupling the transistor(s) to the output lead(s). A field effect transistor (FET) in such a high power semiconductor device package may include interdigitated drain and gate runners. The gate of the FET is driven by an input signal tapped from the gate runner. Miniaturization of integrated circuits is critical to enable compact circuit design, increase the quantity of IC dies per wafer, and thereby reduce the cost of such IC dies. However, compact circuit designs can increase electric coupling between, for example, the gate and drain runners of such integrated circuits. This electric coupling can add parasitic feedback capacitance that may reduce amplifier stability and reduce gain.

SUMMARY

Aspects of the disclosure are defined in the accompanying claims.

In a first aspect, there is provided a transistor comprising a semiconductor substrate having a first terminal and a second terminal and an interconnect structure on an upper surface of the semiconductor substrate, the interconnect structure being formed of multiple layers of dielectric material and electrically conductive material. The electrically conductive material of the interconnect structure comprises a pillar in electrical contact with the first terminal; a first runner electrically connected to the pillar; a tap interconnect in electrical contact with the second terminal; a second runner electrically connected to the tap interconnect; a shield structure positioned between the pillar and the tap interconnect; and a shield runner electrically connected to the shield structure, the shield runner overlying the second runner in a direction perpendicular to the upper surface of the semiconductor substrate.

In a second aspect, there is provided a transistor comprising a semiconductor substrate having a first terminal and a second terminal and an interconnect structure on an upper surface of the semiconductor substrate, the interconnect structure being formed of multiple layers of dielectric material and electrically conductive material, wherein the electrically conductive material layer includes a first layer, a second layer spaced apart from the first layer by a first dielectric material layer of the dielectric material, and a third layer spaced apart from the second layer by a second dielectric material layer of dielectric material, wherein the first layer resides closest to the upper surface of the semiconductor substrate relative to the second and third layers, the second layer is interposed between the first and third layers. The electrically conductive material of the interconnect structure comprises a pillar in electrical contact with the first terminal; a first runner formed in the third layer and electrically connected to the pillar; a tap interconnect in electrical contact with the second terminal, the tap interconnect being formed at a tap location; a second runner formed in the second layer and electrically connected to the tap interconnect; a shield structure formed in the second layer and positioned between the pillar and the tap interconnect, a segment of the shield structure overlying a portion of the second terminal at the tap location in a direction perpendicular to the upper surface of the semiconductor substrate; and a shield runner formed in the third layer and electrically connected to the shield structure, the shield runner overlying the second runner in a direction perpendicular to the upper surface of the semiconductor substrate.

In a third aspect, there is provided a transistor comprising a semiconductor substrate having a first terminal and a second terminal and an interconnect structure on an upper surface of the semiconductor substrate, the interconnect structure being formed of multiple layers of dielectric material and electrically conductive material, wherein the electrically conductive material layer includes a first layer, a second layer spaced apart from the first layer by a first dielectric material layer of the dielectric material, and a third layer spaced apart from the second layer by a second dielectric material layer of dielectric material, wherein the first layer resides closest to the upper surface of the semiconductor substrate relative to the second and third layers, the second layer is interposed between the first and third layers. The electrically conductive material of the interconnect structure comprises a pillar in electrical contact with the first terminal; a first runner formed in the third layer and electrically connected to the pillar; a tap interconnect in electrical contact with the second terminal, the tap interconnect including a first tap interconnect segment formed in the second layer; a second runner formed in the second layer and electrically connected to the tap interconnect; a shield structure formed in the second layer and positioned between the pillar and the tap interconnect, the shield structure including a base segment, a first leg, and a second leg, the first and second legs extending from opposing ends of the base segment in a direction that is antiparallel to a length of the base segment, wherein the first tap interconnect segment of the tap interconnect resides between the first and second legs; and a shield runner formed in the third layer and electrically connected to the shield structure, the shield runner overlying the second runner in a direction perpendicular to the upper surface of the semiconductor substrate.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
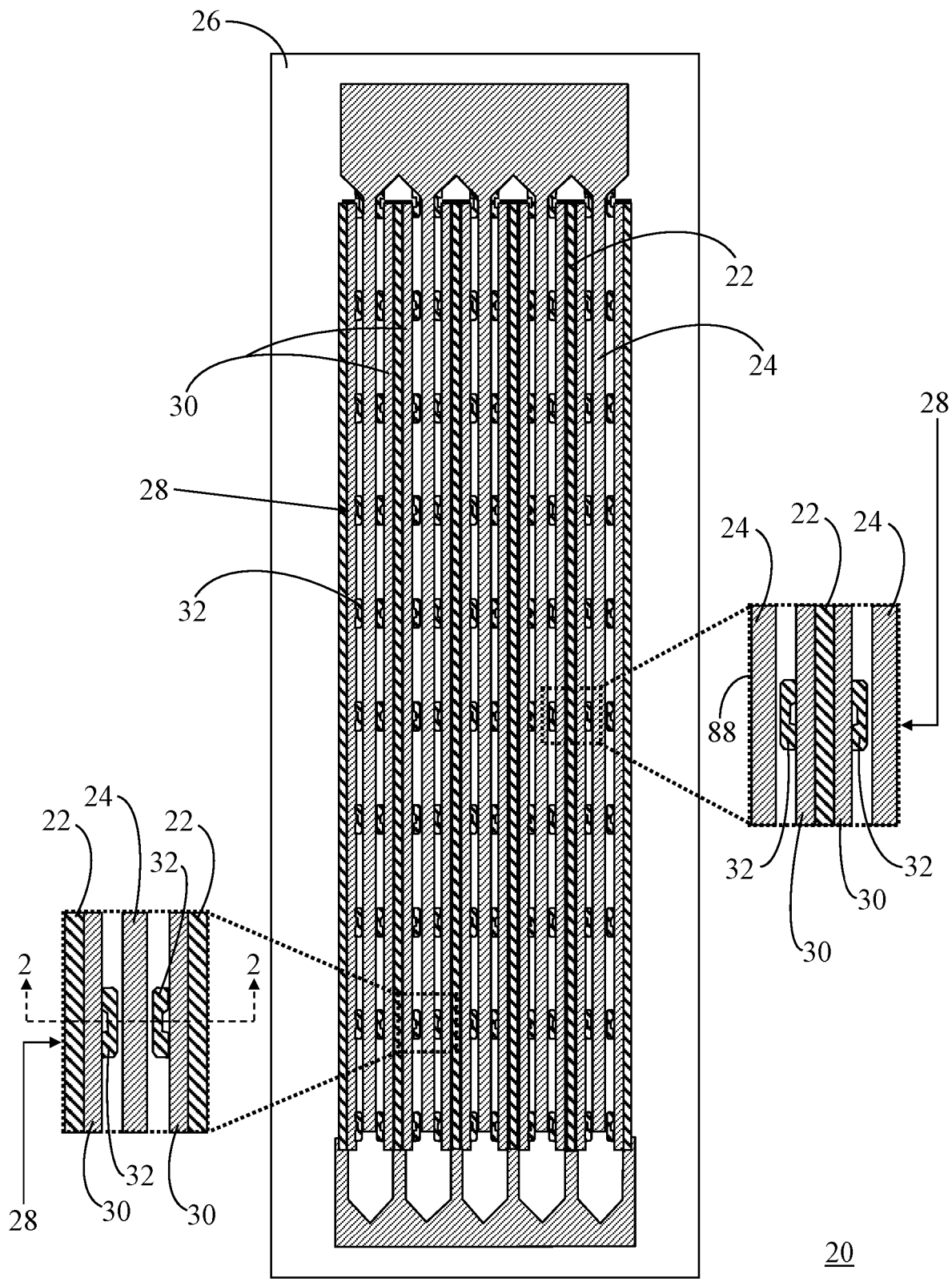
FIG. 1 shows a simplified top view of an example of a transistor having interdigitated drain and gate runners.

In overview, embodiments disclosed herein entail a transistor in a compact form factor having a shield structure within an interconnect structure of the transistor. More specifically, embodiments can include multiple shield structures strategically located along the runners of a multiple runner interdigitated transistor near positions where the input interconnections approach the output interconnections (tap locations). The shield structure has an approximately U-shaped or forked geometry formed in a layer of electrically conductive material, electrically conductive vias that extend through a dielectric material layer of the interconnect structure and connect to an underlying ground plane, and electrically conductive vias that extend through another dielectric material layer of the interconnect structure and connect to overlying shield runners. The shield runners may be suitably positioned to overlap with or overlie corresponding gate runners. The shield structures may additionally overlap gates of the transistor at gate tap locations and tap interconnect segments at the gate tap locations may be surrounded by the forked geometry of the shield structures. The geometry of the shield structure may enable a reduction in electric coupling between the gate and drain features of the transducer to effectively increase the gain of the active device (e.g., transistor) without degrading device stability. Further, the geometry of the shield structures and their location at the tap locations can enable a compact and highly integrated system design.

The following description entails the implementation of a shield structure within an interconnect structure of a field effect transistor (FET) in a non-limiting fashion. Multiple shield structures may be strategically located along the gate runner of a multiple runner interdigitated FET and extending through the interconnect structure near positions where the input connections from a gate runner approach the output interconnections to a drain runner. It should be understood, however, that the shield structure may be implemented within a wide variety of unipolar and bipolar transistor technologies.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

FIG. 1 shows a simplified top view of an example of a transistor 20 having interdigitated drain and gate runners 22, 24. That is, drain and gate runners 22, 24 are closely positioned relative to one another in an alternating arrangement. Gates (not visible) generally surround drain regions (not visible) formed within a semiconductor substrate 26 of an intrinsic device underlying drain and gate runners 22, 24. Transistor 20 further includes a plurality of tap interconnects (not visible) formed from electrically conductive material, typically metal. The tap interconnects are electrically connected between gate runners 24 and gate taps or gate electrodes of the gates formed within semiconductor substrate 26. The positions at which the tap interconnects are located are referred to herein as tap locations 28. Transistor 20 may further include shield runners 30 interposed between each pair of drain and gate runners 22, 24, and shield structures 32 may be electrically connected to shield runners 30. Shield structures 32 may be suitably located at tap locations 28 and are configured to reduce electric coupling between drain and gate runners 22, 24. The interdigitated drain, gate, and shield runners 22, 24, 30 may be formed in one or more metal layers (referred to herein as an interconnect structure) above semiconductor substrate 26.

Figure 2:
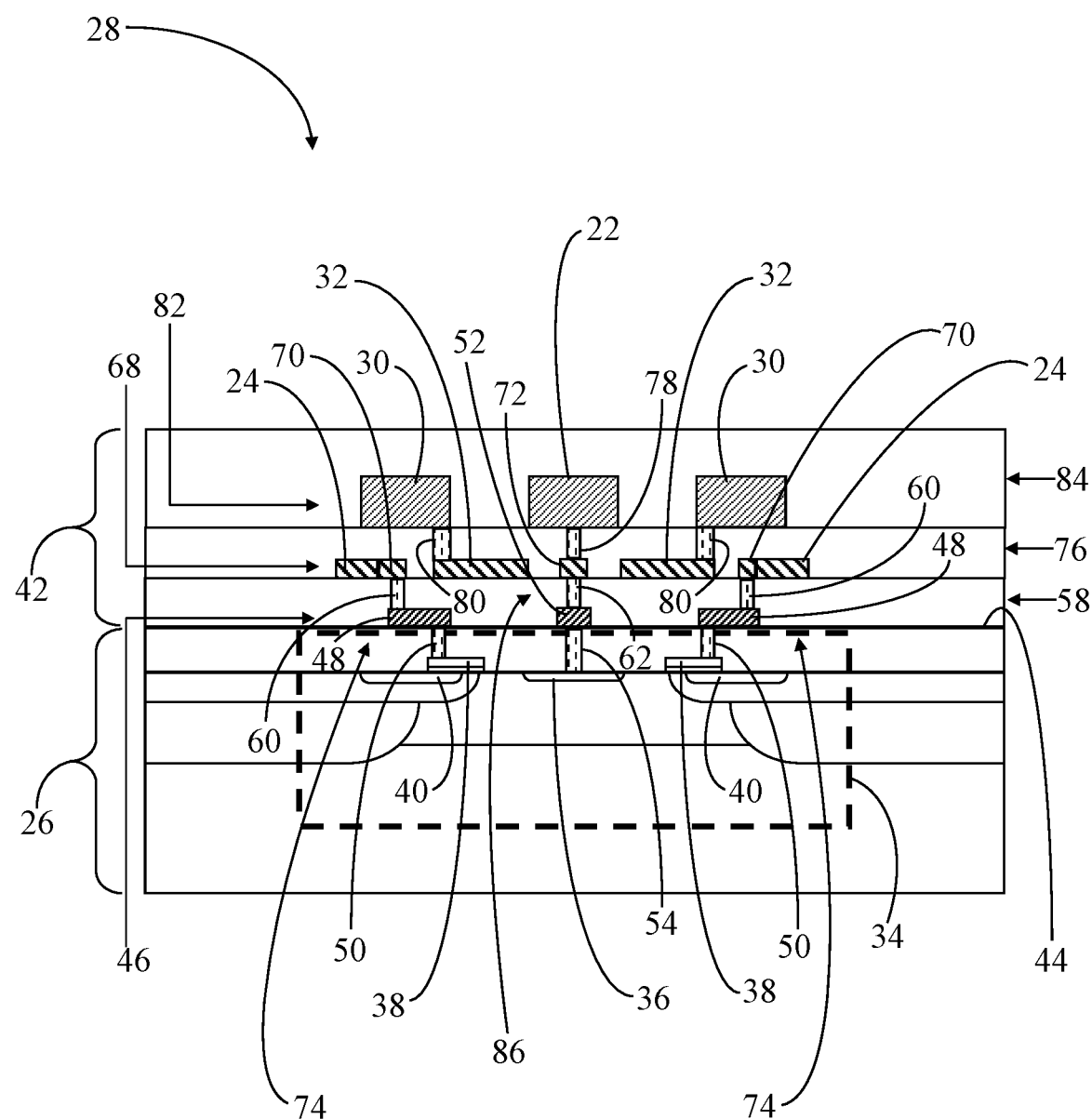
FIG. 2 shows a side sectional view of a portion of the transistor along section line 2-2 of FIG. 1 in accordance with an embodiment.

Referring now to FIG. 2, FIG. 2 shows a side sectional view of a portion of transistor 20 along section line 2-2 of an enlarged portion of FIG. 1 at one of tap locations 28 in accordance with an embodiment. Transistor 20 includes an intrinsic active device, e.g., a FET 34 (represented generally be a dashed line box), formed in semiconductor substrate 26. FET 34 within semiconductor substrate 26 includes, among other features, a first terminal, referred to herein as a drain region 36 and a second terminal, referred to herein as gate electrodes 38. Gate electrodes 38 (also simply referred to as gates) are electrically coupled to gate regions 40 (sometimes referred to as channels) of FET 34. Further details of FET 34 are known to those skilled in the art and are therefore not described herein for brevity. It bears repeating that although a FET design is discussed herein, a wide variety of unipolar and bipolar transistor technologies may alternatively be implemented.

An interconnect structure 42 is formed on an upper surface 44 of semiconductor substrate 26. As discussed above, interconnect structure 42 of transistor 20 includes a plurality of interdigitated first and second runners, e.g., drain and gate runners 22, 24. Additionally, interconnect structure 42 includes shield runners 30 interposed between each drain and gate runner 22, 24. Only a single drain runner 22, two gate runners 24, and two shield runners 30 are shown in the side sectional view of FIG. 2 for simplicity of illustration. However, transistor 20 may be configured to include the multiplicity of drain, gate, and shield runners 22, 24, 30 shown in FIG. 1. Additionally, gate electrodes 38 may be structured on opposing sides of drain runners 22.

Interconnect structure 42 may be formed of multiple layers of dielectric material and electrically conductive material. In the illustrated configuration, a first conductive layer 46 (represented by dark upward and rightward directed narrow hatching) is suitably formed on upper surface 44 of semiconductor substrate 26 to include tap interconnect segments 48 (two shown) electrically connected to gate electrodes 38 by way of electrically conductive vias 50, and drain segments 52 (one shown) electrically connected to drain region 36 by way of an electrically conductive via 54. Additionally, a ground plane 56 (see FIG. 4) is formed in first conductive layer 46 on upper surface 44. Ground plane 56 will be described in greater detail below. Of course, other structures may additionally be formed on upper surface 44 of semiconductor substrate 26 that are not illustrated herein for simplicity.

A first dielectric material layer 58 is formed over first conductive layer 46. Electrically conductive vias 60, 62 may be suitably formed extending through first dielectric material layer 56. By way of example, electrically conductive vias 60 extend through first dielectric material layer 58 and are in electrical contact with each of tap interconnect segments 48. Likewise, electrically conductive via 62 extends through first dielectric layer 58 and is in electrical contact with drain segment 52.

A second electrically conductive layer 68 (represented by downward and rightward directed wide hatching) is suitably formed on first dielectric material layer 58. Second electrically conductive layer 68 includes tap interconnect segments 70 in electrical contact with conductive vias 60. Second electrically conductive layer 68 further includes a drain segment 72 in electrical contact with conductive via 62. Still further, second electrically conductive layer 68 includes shield structures 32 interposed between tap interconnect segments 70 and drain segment 72. In this illustrated configuration, tap interconnect segments 70 serve as gate transmission lines interconnecting vias 60 with gate runners 24 also formed in second electrically conductive layer 68. Thus, collectively, tap interconnect segment 48, vias 60, and tap interconnect segment 70 yield individual tap interconnects 74 between vias 50/gate electrodes 38 and gate runners 24. Only two tap interconnects 74 are illustrated in FIG. 2 for clarity. However, it should be understood that transistor 20 may include a plurality of tap interconnects 74 in accordance with a configuration of interdigitated drain and gate runners 22, 24 like that shown in FIG. 1.

A second dielectric material layer 76 is formed over tap interconnect segments 70, gate runners 24, drain segment 72, and shield structures 32 of second electrically conductive layer 68. In this example, an electrically conductive via 78 may be suitably formed extending through second dielectric material layer 76 and is in electrical contact with drain segment 72. Additionally, electrically conductive vias 80 may be suitably formed extending through second dielectric material layer 76 and are in electrical contact with shield structures 32.

A third electrically conductive layer 82 (represented by light upward and rightward directed narrow hatching) is formed on second dielectric material layer 76. In this example, drain runner 22 and shield runners 30 are formed in third electrically conductive layer 82. Thereafter, a third dielectric material layer 84 may be formed over drain runner 22 and shield runners 30. Drain runner 22 is in electrical contact with electrically conductive via 78. Thus, collectively, the combination of drain segment 52, via 62, drain segment 72, and via 78 yield a drain pillar 86 for transistor 20 that electrically interconnects drain region 36/via 54 of intrinsic FET 34 to drain runner 22.

In general, gate electrodes 38 of intrinsic FET 34 are driven by an input signal tapped from gate runners 24 via tap interconnects 74 to gate electrodes 38 at tap locations 28. Thus, tap locations 28 are the positions where tap interconnects 74 approach drain pillar 86 within interconnect structure 42. The potential for undesirable electric coupling between the output metallization (i.e., drain pillar 86) and the input metallization (i.e., tap interconnects 74) is greatest at tap locations 28. Electric coupling is defined herein as the energy stored in electric field lines between coupled electrodes. In circuit theory, it is manifested as a capacitance between two nodes in the circuit. For example, due to the electric coupling, the input signal tapped from gate runners 24 can add parasitic feedback capacitance to an output signal from drain runner 22. Thus, electric coupling can reduce amplifier stability and reduce gain. Further, this electric coupling may be exacerbated in the compact form factor required for miniaturized transistors.

In accordance with an embodiment, shield runners 30 overlie gate runners 24 in a direction perpendicular to upper surface 44 of semiconductor substrate 26. The partial overlap of shield runners 30 over gate runners 24 may enable effective shielding of gate runners 24 from drain runners 22.

Active devices used in, for example, RF power amplifier applications, suffer from parasitic terminal capacitances that act to reduce RF bandwidth, degrade stability, and reduce gain. The inclusion of shield structures 32 described in detail below are strategically located along the gate finger of a multi-finger interdigitated transistor near positions where the input interconnections approach the output interconnections (e.g., at tap locations 28). Shield structures 32 can reduce an amount of feedback capacitance of the active intrinsic device (FET 34), effectively increasing amplifier gain without degrading amplifier stability.

As illustrated above, interconnect structure 42 of transistor 20 includes three electrically conductive (e.g., metal) layers, with first conductive layer 46 residing closest to upper surface 44 of substrate 26 relative to second and third conductive layers 68, 82 and second conductive layer 68 being interposed between first and third conductive layers 42, 82. A minimal quantity of metal layers within interconnect structure 42 may enable a reduction in fabrication and material costs of interconnect structure 42 relative to interconnect structures having more than three metal layers. Additionally, the three metal layer implementation versus implementations with a greater quantity of metal layers may be beneficial in transistor technologies, such as in gallium nitride (GaN) based transistors. Shield structure 32 is connected to ground plane 56 (FIG. 4) underlying shield structure 32 and is strategically placed to block maximum coupling and is designed to yield maximum shielding with minimal degradation of other capacitances. Thus, shield structure 32 can be effectively implemented within the three metal layer design of interconnect structure 42. It should be understood however that shield structure 32 may be alternatively implemented for technologies with more than three metal layers.

Figure 3:
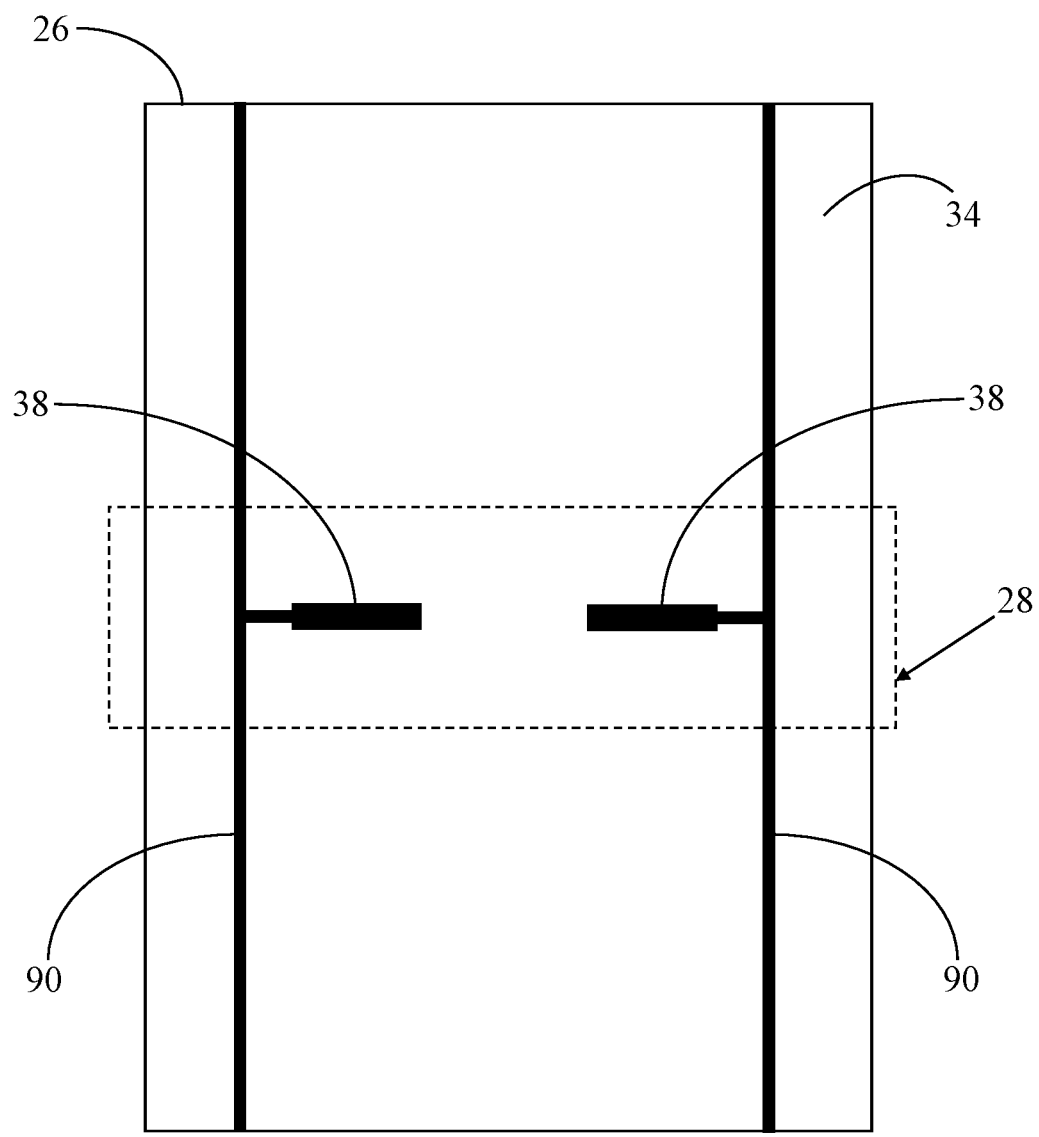
FIG. 3 shows a top view of a portion of the transistor of FIG. 1 at an initial stage of processing to form an interconnect structure of the transistor.

FIG. 3 shows a top view of a portion of transistor 20 (FIG. 1) at an initial stage of processing to form interconnect structure 42 (FIG. 2). More particularly, FIG. 3 represents a top view of the enlarged portion of transistor 20 surrounded by a dashed line box 88 on the right side of the sheet on which FIG. 1 is presented. In this example, the second terminal further includes a signal bus, referred to herein as gate fingers 90. Thus, gate fingers 90 together with gate electrodes 38 form the second terminal or gate (e.g., an input) for transistor 20. Gate fingers 90 are formed in substrate 26 and gate electrodes 38 are located at tap locations 28 (denoted by a dashed line box) along gate fingers 90. Gate fingers 90 are characterized by a length that is considerably longer than that shown in FIG. 3. For example, the length of gate fingers 90 may be at least as long as gate runners 24 of transistor 20 illustrated in FIG. 1. Additionally, a multiplicity of gate electrodes 38 may extend from gate fingers 90 at a multiplicity of tap locations 28 as shown in FIG. 1. Of course, the remaining features (not shown for simplicity) of intrinsic FET have also been formed in substrate 26. Thus, FIG. 3 represents a condition in which the electrically conductive and dielectric layers of interconnect structure 42 have not yet been formed over intrinsic FET 34.

Figure 4:
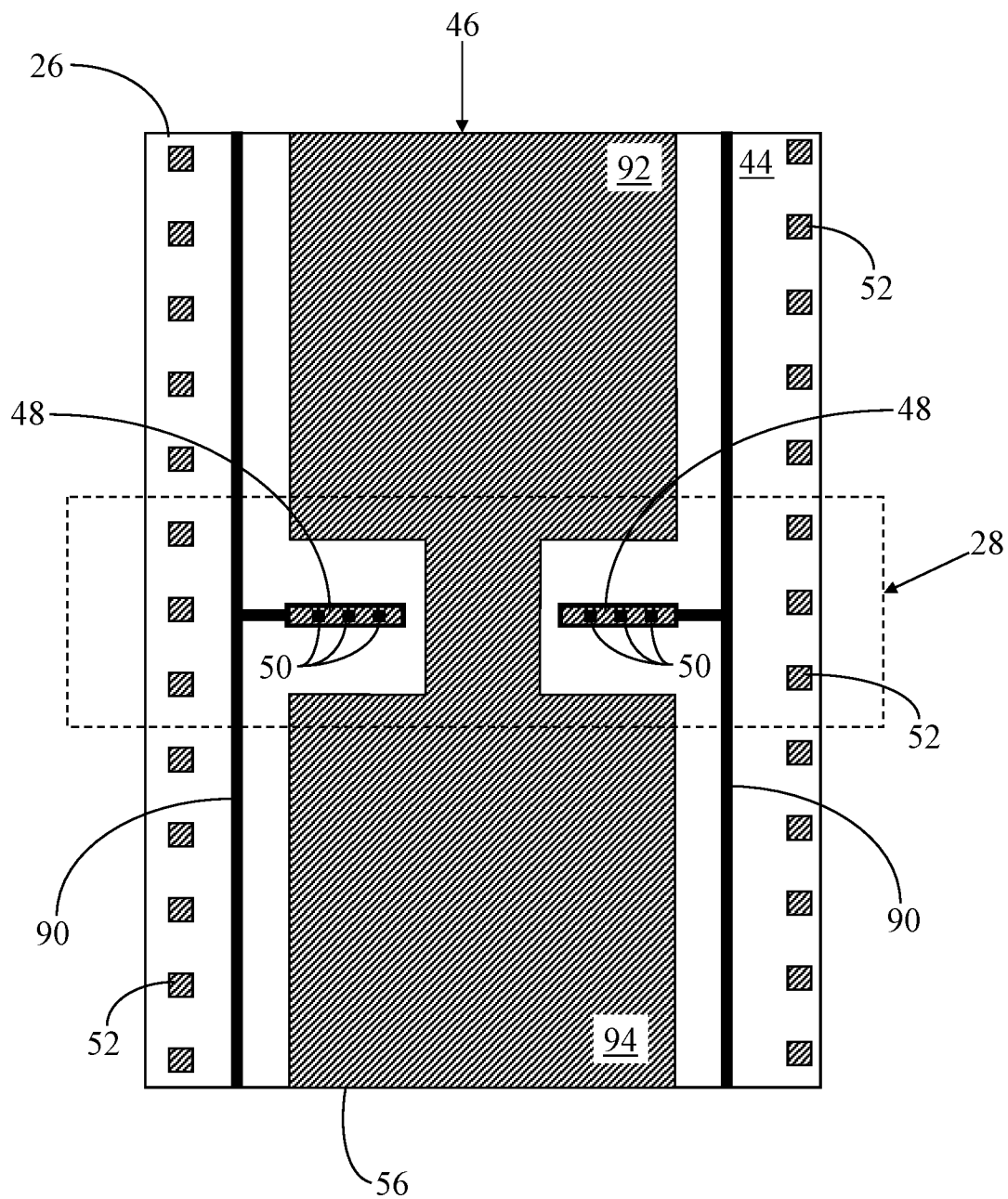
FIG. 4 shows a top view of the portion of the transistor of FIG. 3 at a subsequent stage of processing to form the interconnect structure.

FIG. 4 shows a top view of the portion of the transistor of FIG. 3 at a subsequent stage of processing to form interconnect structure 42 (FIG. 1). In this example, first conductive layer 46 has been suitably formed on upper surface 44 of semiconductor substrate 26. For example, an electrically conductive material such as a metal layer may be suitably deposited, patterned, and etched to yield the desired structures (e.g., tap interconnect segments 48, drain segments 52, and ground plane 56). Tap interconnect segments 48 may be coupled to the underlying gate electrodes 38 (best seen in FIG. 3) utilizing conductive vias 50 and drain segments 52 may be coupled to the underlying drain region 36 (FIG. 2) utilizing conductive vias 54 (shown in FIG. 2). Tap interconnect segments 48 are laterally spaced apart from and therefore electrically isolated from the surrounding material of first conductive layer 46. This surrounding material includes ground plane 56. In an illustrative example, ground plane 56 includes a first section 92 and a second section 94. Tap interconnect segments 48 may be formed in the spaces between adjacent sections 92, 94 of ground plane 56.

Figure 5:
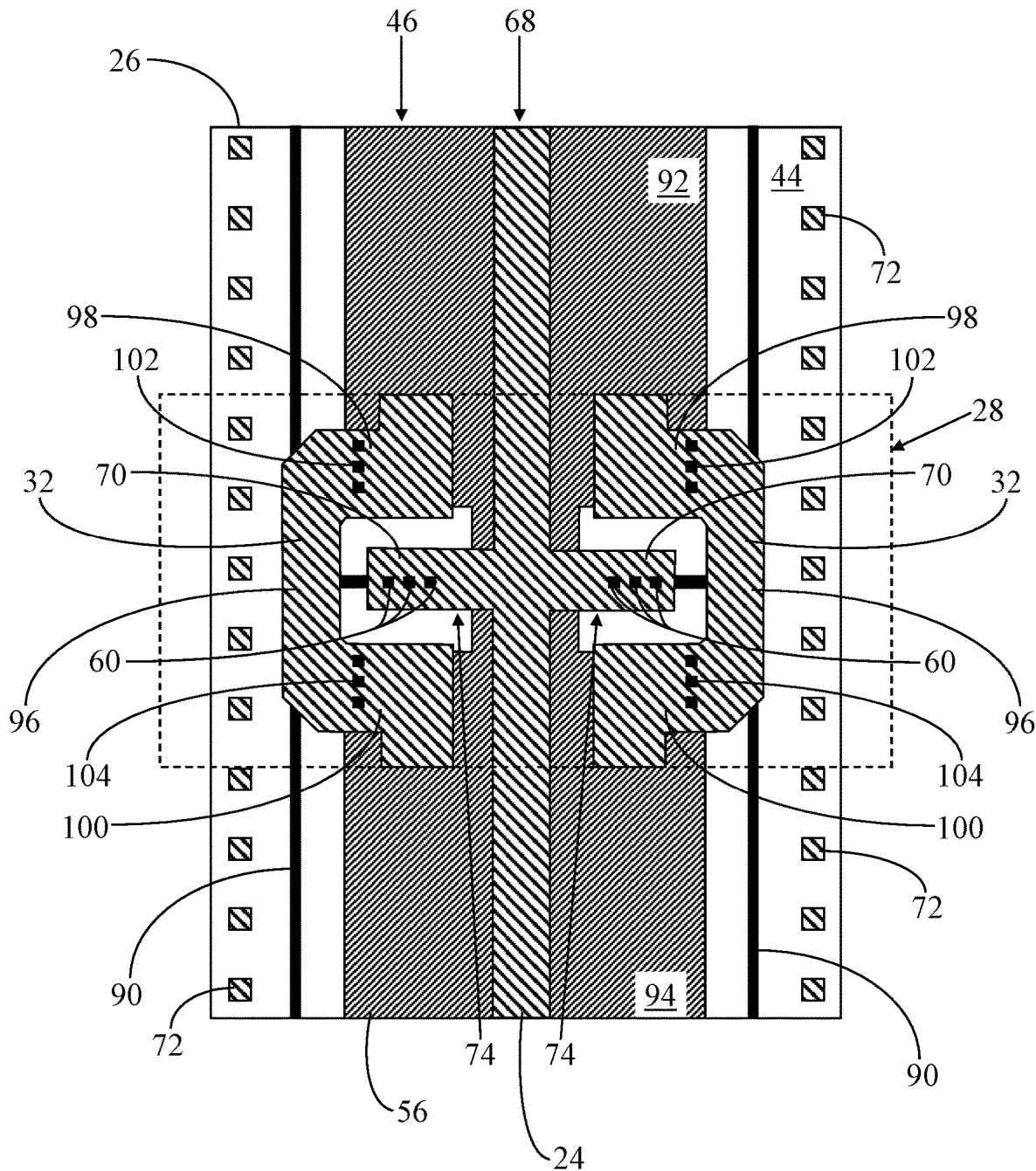
FIG. 5 shows a top view of the portion of the transistor of FIG. 4 at a subsequent stage of processing to form the interconnect structure.

FIG. 5 shows a top view of the portion of the transistor of FIG. 4 at a subsequent stage of processing to form interconnect structure 42 (FIG. 1). In this example, second conductive layer 68 has been formed on first dielectric material layer 58 (FIG. 2). For clarity, first dielectric material layer 58 is not shown in FIG. 5 in order to visualize the stacked relationship of structures within first and second conductive layers 46, 68. Again, an electrically conductive material such as a metal layer may be deposited, patterned, and etched to yield the desired structures (e.g., gate runners 24, shield structures 32, tap interconnect segments 70, and drain segments 72). Tap interconnect segments 70 may be coupled to the underlying tap interconnect segments 48 (FIG. 4) utilizing conductive vias 60 and drain segments 72 may be coupled to the underlying drain segments 52 (FIG. 4) utilizing conductive vias 62 (FIG. 2).

Shield structure 32, formed in second conductive layer 68 includes a base segment 96, a first leg 98, and a second leg 100 in which first and second legs 98, 100 extend from opposing ends of base segment 96 in a direction that is antiparallel to a length of base segment 96. That is, all of base segment 96, first leg 98, and second leg 100 are formed in second conductive layer 68 to yield a shield structure 32 having an approximately U-shaped or forked geometry.

In accordance with some embodiments, base segments 96 of shield structures 32 overlie a portion of the second terminal (e.g., a portion of gate finger 90) at tap locations 28 in a direction perpendicular to upper surface 44 of substrate 26 (FIG. 2). However, base segments 96 of shield structures 32 do not overlie gate fingers 90 outside of tap locations 28. Indeed, as mentioned previously interconnect structure 42 includes multiple tap interconnects 74 in electrical contact with gate fingers 90 and extending through first and second dielectric material layers 58, 76 (FIG. 2). Further, one of tap interconnects 74 is formed at each of tap locations 28 between the second terminal (e.g., gate electrode 38) and gate runners 24. Additionally, one of the multiple shield structures 32 is positioned at each of tap locations 28, and the multiple shield structures 32 do not overlie gate fingers 90 outside of the multiple tap locations 28. The position of base segments 96 of shield structure 32 relative to the underlying portions of gate fingers 90 at tap locations 28 may reduce electric coupling from drain pillars 86. Further, the absence of shield structures 32 over gate fingers 90 outside of tap locations 28 may enable the gate to source capacitance to be kept to a minimum.

It should be recalled that first and second sections 92, 94 of ground plane 56 are formed in first electrically conductive layer 46. Shield structure 32, formed in second electrically conductive layer 68 is vertically spaced apart from first and second sections 92, 94 of ground plane 56. At least one electrically conductive via 102 extends through first dielectric material layer 58 (FIG. 2) and is coupled to each of first leg 98 and first section 92 of ground plane 56. Likewise, at least one electrically conductive via 104 extends through first dielectric material layer 58 and is coupled to each of second leg 100 and second section 94 of ground plane 56. Thus, first and second sections 92, 94 of ground plane 56 and shield structure 32 are electrically coupled by vias 102, 104.

In accordance with some embodiments, tap interconnect segment 70 formed in second conductive layer 68 of tap interconnect 74 resides between first and second legs 98, 100 of shield structure 32 also formed in second conductive layer 68. The position of tap interconnect segment 70 interposed between first and second legs 98, 100 of shield structure may effectively insulate tap interconnect segment 70 to further reduce electric field coupling from drain runner 22 to tap interconnect segment 70.

Figure 6:
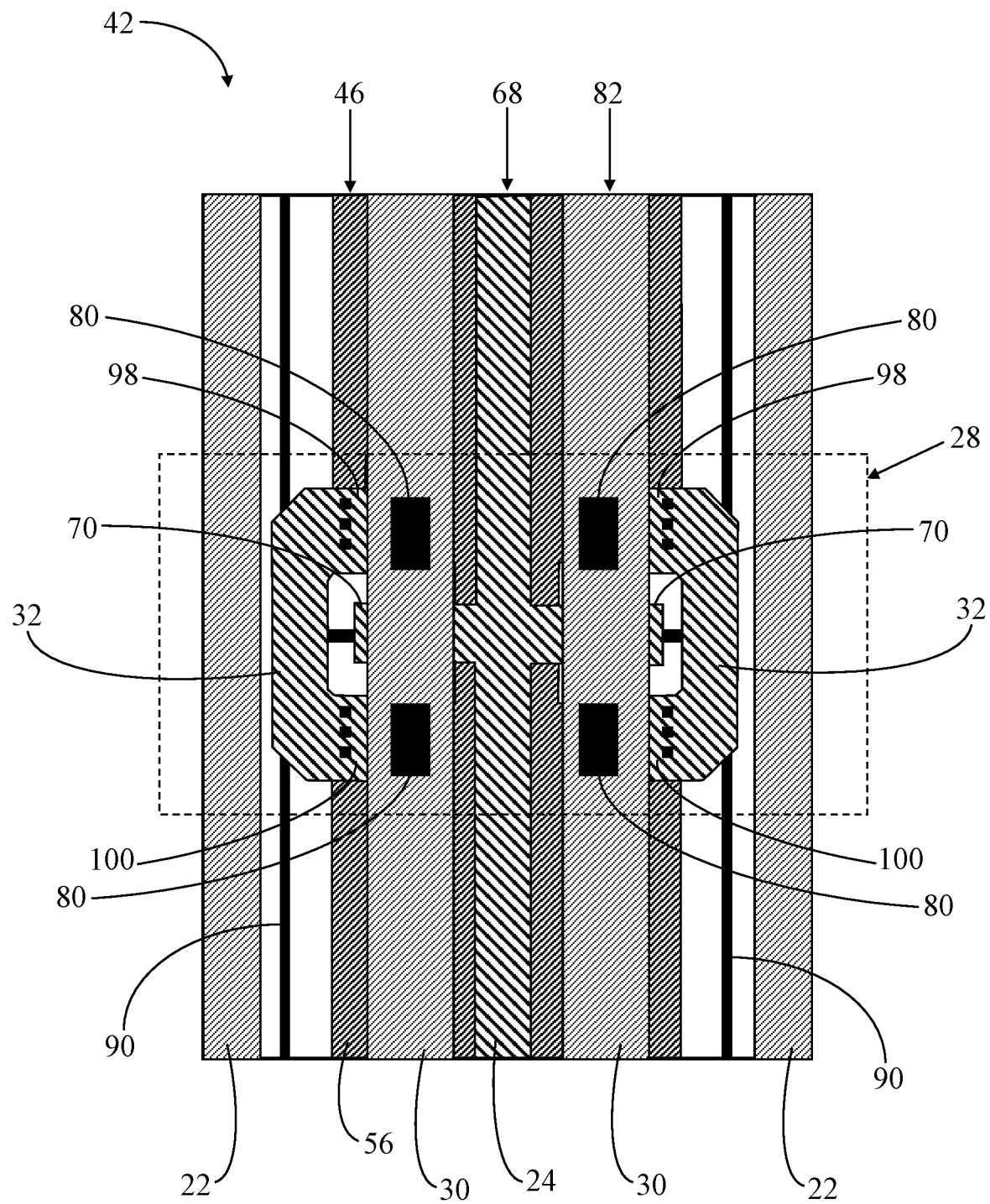
FIG. 6 shows a top view of the portion of the transistor of FIG. 5 at a subsequent stage of processing to form the interconnect structure.

Referring now to FIG. 6, FIG. 6 shows a top view of the portion of transistor 20 of FIG. 5 at a subsequent stage of processing to form interconnect structure 42. In this example, third conductive layer 82 has been formed on second dielectric material layer 76 (FIG. 2). Again for clarity, first, second, and third dielectric material layers 58, 76, 84 (FIG. 2) are not shown in FIG. 6 in order to visualize the stacked relationship of structures within first, second, and third conductive layers 46, 68, 82. An electrically conductive material such as a metal layer may be deposited, patterned, and etched to yield the desired structures (e.g., drain runners 22 and shield runners 30) in third conductive layer 82. Shield runners 30 may be coupled to the underlying first and second legs 98, 100 of shield structures 32 utilizing conductive vias 80. Additionally, drain runners 22 may be coupled to the underlying drain segments 72 (FIG. 2) utilizing conductive vias 78 (FIG. 2).

Figure 7:
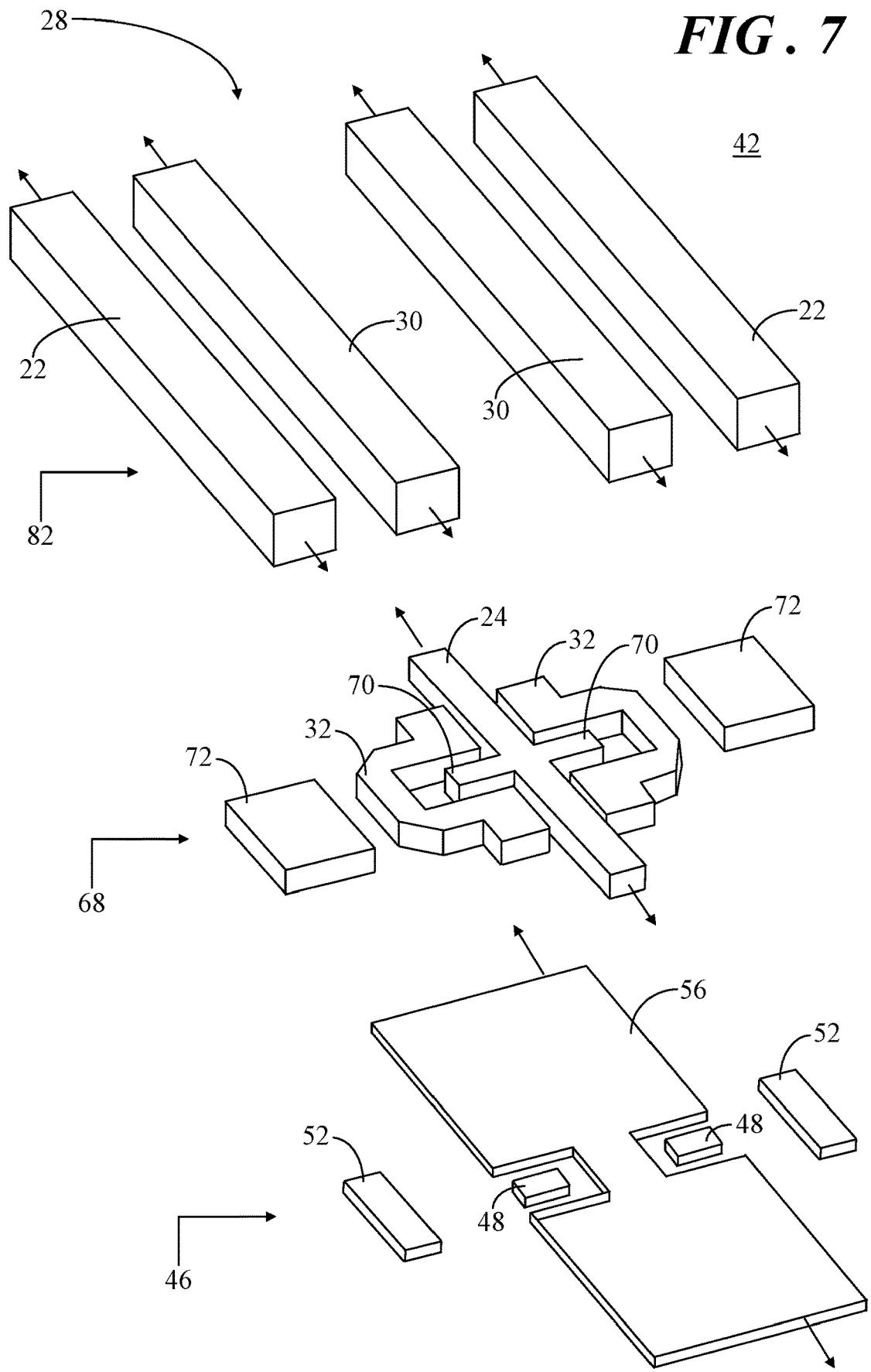
FIG. 7 shows an exploded perspective view of electrically conductive material of the interconnect structure.

FIG. 7 shows an exploded perspective view of the electrically conductive material (e.g. first, second, third electrically conductive layers 46, 68, 82) of interconnect structure 42 for transistor 20 (FIG. 2). The dielectric material layers and the conductive vias are not shown so that the individual layers of electrically conductive material at tap locations 28 can be visualized. As shown, first conductive layer 46 includes tap interconnect segments 48, drain segments 52, and ground plane 56. Arrows extending from ground plane 56 indicate that ground plane 56 may extend in opposing directions to accommodate the design size of transistor 20 (FIG. 1). Second conductive layer 68 includes gate runner 24 with tap interconnect segments 70 extending therefrom, shield structures 32 surrounding tap interconnect segments 70, and drain segments 72. Again, arrows extending from gate runner 24 indicate that gate runner 24 may extend in opposing directions in accordance with the design of transistor 20. Third conductive layer 82 includes drain runners 22 and shield runners 30, with arrows extending from drain and shield runners 22, 30 to indicate their lengths according to the design of transistor 20.

Figure 8:
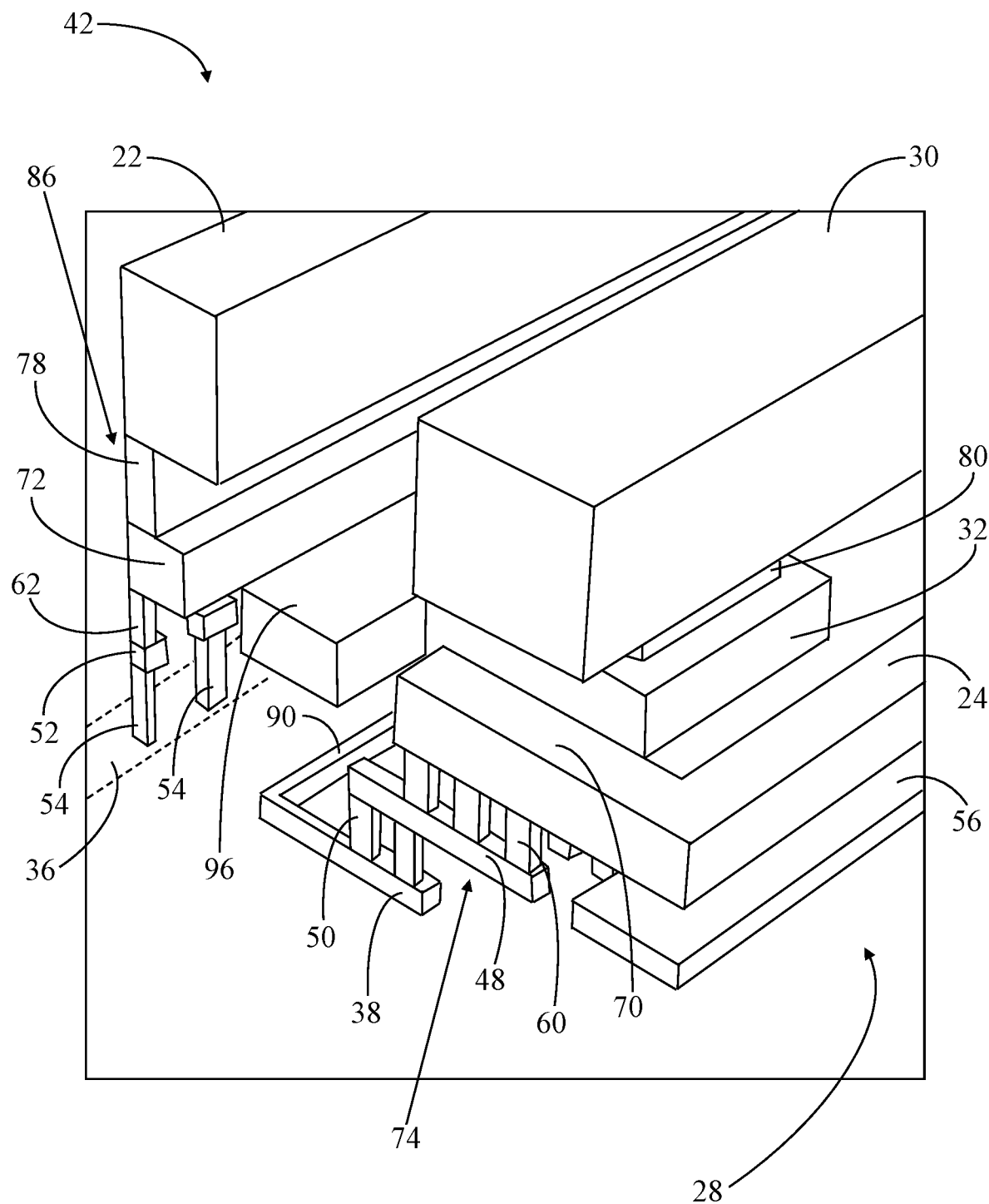
FIG. 8 shows a partial perspective view of the interconnect structure of the transistor.

FIG. 8 shows a partial perspective view of interconnect structure 42 of transistor 20 (FIG. 1). In general, FIG. 8 represents one half of the cross-section of interconnect structure 42 at section lines 2-2 of FIG. 1. Thus, tap interconnect 74 includes tap interconnect segment 48, conductive vias 60, and tap interconnect segment 70 such that gate electrodes 38 of intrinsic FET 34 (FIG. 2) are driven by an input signal tapped from gate runner 24 via tap interconnect 74 to gate electrodes 38/conductive vias 50. Further, the combination of drain segment 52, via 62, drain segment 72, and via 78 yield drain pillar 86 that electrically interconnects drain region 36/via 54 of intrinsic FET 34 to drain runner 22. In the example of FIG. 8, drain region 36 is represented by a dashed line channel region below vias 54. Still further, shield structure 32 is positioned between drain pillar 86 and tap interconnect 74, and is electrically coupled with shield runner 30 by conductive via 80 and is electrically coupled with the underlying ground plane 56. As such, shield runner 30 overlies gate runner 24, base segment 96 of shield structure 32 overlies gate finger 90 at tap location 28, and first and second legs 98, 100 (best seen in FIG. 5) surround tap interconnect segment 70.

Accordingly, an embodiment described above includes a number of features that may collectively reduce electric coupling between the gate and drain of the transistor. These features include a top shield runner (e.g., shield runner 30) overlying a lower layer gate runner (e.g., gate runner 24), a segment of a shield structure (e.g., base segment 96 of shield structure 32) overlying a portion of the gate (e.g., gate fingers 90) at the tap locations (e.g., tap locations 28), and a tap interconnect segment of the tap interconnect (e.g., tap interconnect segment 70 of tap interconnect 74) being surrounded by the shield structure (e.g., first and second legs 98, 100 of shield structure 32). Such a structural configuration may enable a compact transistor configuration and highly integrated system design. Further, the geometry of the shield structure may effectively increase the gain of the active device (e.g., transistor) without degrading stability by reducing electric coupling.

The configuration described above includes all three of the previously discussed features for reducing electric coupling between gate structures and drain structures, between gate structures and shield structures, and between drain structures and shield structures. However, alternative embodiments may be configured to have less than the three features. For example, an interconnect structure configuration may only include a top shield runner overlying a lower layer gate runner. Another interconnect structure configuration may include the top shield runner overlying a lower layer gate runner along with a segment of the shield structure overlying a portion of the gate at the tap locations. Still another interconnect structure configuration may include top shield runner overlying a lower layer gate runner along with the tap interconnect segment of the tap interconnect being surrounded by the shield structure. Still other interconnect structure configurations may include one or both of a segment of the shield structure overlying a portion of the gate at the tap locations and the tap interconnect segment of the tap interconnect being surrounded by the shield structure without the top shield runner overlying a lower layer gate runner. Additionally, it bears repeating that a configuration may include more than the three electrically conductive layers and three dielectric material layers shown and discussed herein.

Transistor 20 may be a primary active component of a Doherty power amplifier having one carrier amplifier and one peaking amplifier, as known to those skilled in the art. However, it should be understood, based on the description herein, that embodiments of the inventive subject matter may be used in conjunction with virtually any type of multiple path amplifier. Accordingly, the transistor having the shield structures described herein is not limited to use with Doherty amplifiers, but may alternatively be implemented within a wide variety of circuits.

Accordingly, embodiments disclosed herein entail a transistor in a compact form factor having a shield structure within an interconnect structure of the transistor. More specifically, embodiments can include multiple shield structures strategically located along the runners of a multiple runner interdigitated transistor near positions where the input interconnections approach the output interconnections (tap locations). The shield structure has an approximately U-shaped or forked geometry formed in a layer of electrically conductive material, electrically conductive vias that extend through a dielectric material layer of the interconnect structure and connect to an underlying ground plane, and electrically conductive vias that extend through another dielectric material layer of the interconnect structure and connect to overlying shield runners. The shield runners may be suitably positioned to overlap with or overlie corresponding gate runners. The shield structures may additionally overlap gates of the transistor at gate tap locations and tap interconnect segments at the gate tap locations may be surrounded by the forked geometry of the shield structures. The geometry of the shield structure may enable a reduction in electric coupling between the gate and drain features of the transducer to effectively increase the gain of the active device (e.g., transistor) without degrading device stability. Further, the geometry of the shield structures and their location at the tap locations can enable a compact and highly integrated system design.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
   a semiconductor substrate having a first terminal and a second terminal; and
   an interconnect structure on an upper surface of the semiconductor substrate, the interconnect structure being formed of multiple layers of dielectric material and electrically conductive material, the multiple layers of electrically conductive material of the interconnect structure comprising:
   a pillar in electrical contact with the first terminal;
   a first runner electrically connected to the pillar;

a first tap interconnect in electrical contact with the second terminal;
a second runner electrically connected to the first tap interconnect;
a shield structure positioned between the pillar and the first tap interconnect; and
a shield runner electrically connected to the shield structure, the shield runner overlying the second runner in a direction perpendicular to the upper surface of the semiconductor substrate.

2. The transistor of claim 1 wherein the multiple layers of electrically conductive material of the interconnect structure comprise:
a first layer of electrically conductive material;
a second layer of electrically conductive material spaced apart from the first layer of electrically conductive material by a first dielectric material layer, the shield structure and the second runner being formed in the second layer of electrically conductive material; and
a third layer of electrically conductive material spaced apart from the second layer of electrically conductive material by a second dielectric material layer, the first runner and the shield runner being formed in the third layer of electrically conductive material, wherein the first layer of electrically conductive material resides closest to the upper surface of the semiconductor substrate relative to the second and third layers of electrically conductive material and the second layer of electrically conductive material is interposed between the first and third layers of electrically conductive material.

3. The transistor of claim 1, wherein:
the first tap interconnect is formed at a first tap location; and
a segment of the shield structure overlies a portion of the second terminal at the first tap location in a direction perpendicular to the upper surface of the semiconductor substrate.

4. The transistor of claim 3 wherein the second terminal extends beyond the first tap location and the shield structure does not overlie the second terminal outside of the first tap location.

5. The transistor of claim 4, wherein the interconnect structure further comprises:
multiple tap interconnects in electrical contact with the second terminal and extending through the multiple layers of dielectric material, one of the multiple tap interconnects being formed at each of a plurality of tap locations between the second terminal and the second runner; and
multiple shield structures, wherein one of the multiple shield structures is positioned at each of the plurality of tap locations, and the multiple shield structures do not overlie the second terminal outside of the plurality of tap locations.

6. The transistor of claim 1, wherein:
the multiple layers of electrically conductive material of the interconnect structure include at least a first layer of electrically conductive material and a second layer of electrically conductive material spaced apart from the first layer of electrically conductive material by a first dielectric material layer, the first layer of electrically conductive material residing closest to the upper surface of the semiconductor substrate relative to the second layer of electrically conductive material;
the first tap interconnect includes a first tap interconnect segment formed in the second layer of electrically conductive material; and
the shield structure is formed in the second layer of electrically conductive material, the shield structure including a base segment, a first leg, and a second leg, the first and second legs extending from opposing ends of the base segment in a direction that is antiparallel to a length of the base segment, wherein the first tap interconnect segment of the first tap interconnect resides between the first and second legs.

7. The transistor of claim 6, wherein the second runner is formed in the second layer of electrically conductive material and the first tap interconnect segment is coupled to and extends from the second runner within the second layer of electrically conductive material.

8. The transistor of claim 6, wherein:
a ground plane is formed in the first layer of electrically conductive material of the interconnect structure; and
at least one electrically conductive via extends through the first dielectric material layer to electrically interconnect the shield structure with the ground plane.

9. The transistor of claim 8, wherein:
the ground plane includes a first section and a second section formed in the first layer of electrically conductive material;
a second tap interconnect segment of the first tap interconnect is formed in the first layer of electrically conductive material between the first and second sections of the ground plane;
a first one of the at least one electrically conductive via is coupled to each of the first leg of the shield structure and the first section of the ground plane; and
a second one of the at least one electrically conductive via is coupled to each of the second leg of the shield structure and the second section of the ground plane.

10. The transistor of claim 1, wherein:
the first tap interconnect forms a portion of an input to the second terminal; and
the pillar forms a portion of an output from the first terminal.

11. A transistor comprising:
a semiconductor substrate having a first terminal and a second terminal; and
an interconnect structure on an upper surface of the semiconductor substrate, the interconnect structure being formed of multiple layers of dielectric material and electrically conductive material, wherein the multiple layers of electrically conductive material include a first layer of electrically conductive material, a second layer of electrically conductive material spaced apart from the first layer of electrically conductive material by a first dielectric material layer of dielectric material, and a third layer of electrically conductive material spaced apart from the second layer of electrically conductive material by a second dielectric material layer of dielectric material, wherein the first layer of electrically conductive material resides closest to the upper surface of the semiconductor substrate relative to the second and third layers of electrically conductive material, the second layer of electrically conductive material is interposed between the first and third layers of electrically conductive material, and the multiple layers of electrically conductive material of the interconnect structure comprise:
a pillar in electrical contact with the first terminal;

a first runner formed in the third layer of electrically conductive material and electrically connected to the pillar;
a first tap interconnect in electrical contact with the second terminal, the first tap interconnect being formed at a first tap location;
a second runner formed in the second layer of electrically conductive material and electrically connected to the first tap interconnect;
a shield structure formed in the second layer of electrically conductive material and positioned between the pillar and the first tap interconnect, a segment of the shield structure overlying a portion of the second terminal at the tap location in a direction perpendicular to the upper surface of the semiconductor substrate; and
a shield runner formed in the third layer of electrically conductive material and electrically connected to the shield structure, the shield runner overlying the second runner in a direction perpendicular to the upper surface of the semiconductor substrate.

12. The transistor of claim 11, wherein the second terminal extends beyond the first tap location and the shield structure does not overlie the second terminal outside of the first tap location.

13. The transistor of claim 12, wherein the interconnect structure further comprises:
multiple tap interconnects in electrical contact with the second terminal and extending through the dielectric material, one of the multiple tap interconnects being formed at each of a plurality of tap locations between the second terminal and the second runner; and
multiple shield structures, wherein one of the multiple shield structures is positioned at each of the plurality of tap locations, and the multiple shield structures do not overlie the second terminal outside of the plurality of tap locations.

14. The transistor of claim 11, wherein:
the first tap interconnect forms a portion of an input to the second terminal; and
the pillar forms a portion of an output from the first terminal.

15. A transistor comprising:
a semiconductor substrate having a first terminal and a second terminal; and
an interconnect structure on an upper surface of the semiconductor substrate, the interconnect structure being formed of multiple layers of dielectric material and electrically conductive material, wherein the electrically conductive material layers include a first layer of electrically conductive material, a second layer of electrically conductive material spaced apart from the first layer of electrically conductive material by a first dielectric material layer of dielectric material, and a third layer of electrically conductive material spaced apart from the second layer by a second dielectric material layer of dielectric material, wherein the first layer of electrically conductive material resides closest to the upper surface of the semiconductor substrate relative to the second and third layers of electrically conductive material, the second layer of electrically conductive material is interposed between the first and third of electrically conductive material layers, and the electrically conductive material of the interconnect structure comprises:

a pillar in electrical contact with the first terminal;
a first runner formed in the third layer of electrically conductive material and electrically connected to the pillar;
a tap interconnect in electrical contact with the second terminal, the tap interconnect including a first tap interconnect segment formed in the second layer of electrically conductive material;
a second runner formed in the second layer of electrically conductive material and electrically connected to the tap interconnect;
a shield structure formed in the second layer of electrically conductive material and positioned between the pillar and the tap interconnect, the shield structure including a base segment, a first leg, and a second leg, the first and second legs extending from opposing ends of the base segment in a direction that is antiparallel to a length of the base segment, wherein the first tap interconnect segment of the tap interconnect resides between the first and second legs; and
a shield runner formed in the third layer of electrically conductive material and electrically connected to the shield structure, the shield runner overlying the second runner in a direction perpendicular to the upper surface of the semiconductor substrate.

16. The transistor of claim 15, wherein:
the tap interconnect is formed at a tap location; and
the base segment of the shield structure overlies the second terminal at the tap location in a direction perpendicular to the upper surface of the semiconductor substrate.

17. The transistor of claim 16, wherein the second terminal extends beyond the tap location and the shield structure does not overlie the second terminal outside of the tap location.

18. The transistor of claim 15, wherein the second runner is formed in the second layer of electrically conductive material and the first tap interconnect segment is coupled to and extends from the second runner within the second layer of electrically conductive material.

19. The transistor of claim 15, wherein:
a ground plane is formed in the first layer of electrically conductive material of the interconnect structure; and
at least one electrically conductive via extends through the first dielectric material layer to electrically interconnect the shield structure with the ground plane.

20. The transistor of claim 19, wherein:
the ground plane includes a first section and a second section formed in the first layer of electrically conductive material;
a second tap interconnect segment of the tap interconnect is formed in the first layer of electrically conductive material between the first and second sections of the ground plane;
a first one of the at least one electrically conductive via is coupled to each of the first leg of the shield structure and the first section of the ground plane; and
a second one of the at least one electrically conductive via is coupled to each of the second leg of the shield structure and the second section of the ground plane.

* * * * *